(12) United States Patent
Yuan

(10) Patent No.: US 8,035,421 B2
(45) Date of Patent: Oct. 11, 2011

(54) VERSATILE CHARGE SAMPLING CIRCUITS

(75) Inventor: Jiren Yuan, Lund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 1091 days.

(21) Appl. No.: 11/099,460

(22) Filed: Apr. 6, 2005

(65) Prior Publication Data

US 2005/0168371 A1 Aug. 4, 2005

Related U.S. Application Data

(62) Division of application No. 09/672,803, filed on Sep. 2, 2000, now Pat. No. 7,053,673.

(30) Foreign Application Priority Data

Sep. 28, 1999 (SE) .................................. 9903532

(51) Int. Cl.
*G11C 27/02* (2006.01)
(52) U.S. Cl. ......................................... 327/91
(58) Field of Classification Search .................. None
See application file for complete search history.

(56) References Cited

U.S. PATENT DOCUMENTS

| | | | | |
|---|---|---|---|---|
| 5,084,683 A * | 1/1992 | Nicollini | ...................... | 330/107 |
| 5,128,966 A * | 7/1992 | Bang | ............................... | 375/328 |
| 5,281,860 A | 1/1994 | Krenik et al. | | |
| 5,414,311 A | 5/1995 | Carley | | |
| 5,617,063 A * | 4/1997 | Chaplik | ......................... | 332/103 |
| 5,698,999 A | 12/1997 | Etoh et al. | | |
| 5,757,862 A * | 5/1998 | Ishizu | ............................ | 375/324 |
| 6,157,331 A | 12/2000 | Liu et al. | | |
| 6,175,728 B1 * | 1/2001 | Mitama | .......................... | 455/323 |
| 6,181,748 B1 | 1/2001 | Lin et al. | | |
| 6,219,534 B1 * | 4/2001 | Torii | .............................. | 455/303 |
| 6,225,837 B1 | 5/2001 | Goumaz | | |
| 6,246,867 B1 * | 6/2001 | Jakobsson | ...................... | 455/324 |
| 6,320,459 B2 | 11/2001 | McCullough | | |
| 6,356,746 B1 * | 3/2002 | Katayama | ..................... | 455/324 |
| 6,366,622 B1 * | 4/2002 | Brown et al. | .................. | 375/322 |
| 6,438,366 B1 * | 8/2002 | Lindfors et al. | ............... | 455/334 |
| 6,757,340 B1 * | 6/2004 | Jakobsson | ...................... | 375/319 |
| 6,943,618 B1 * | 9/2005 | Tanji et al. | ..................... | 327/540 |

FOREIGN PATENT DOCUMENTS

| | | |
|---|---|---|
| DE | 3634637 A1 | 4/1987 |
| EP | 0741391 A2 | 11/1996 |
| JP | 6236698 | 8/1994 |
| JP | 10163912 | 6/1998 |
| WO | WO 96/10827 A1 | 4/1996 |

OTHER PUBLICATIONS

Carley, Richard L. et al., "High-Speed Low-Power Integrating CMOS Sample-and Hold Amplifier Architecture," Custom Integrated Circuits Conference , IEEE, 1995, pp. 543-546.

\* cited by examiner

*Primary Examiner* — An Luu
(74) *Attorney, Agent, or Firm* — Potomac Patent Group PLLC

(57) ABSTRACT

A charge sampling circuit, has a control signal generator for controlling an analog input signal to the charge sampling circuit to be integrated by an integrator during a sampling phase responsive to a sampling signal from the control signal generator. The current of the analog input signal is integrated to an integrated charge for producing a proportional voltage or current sample at a signal output at the end of the sampling phase.

3 Claims, 16 Drawing Sheets

Note: 1. $f_c=1000$ MHz.
2. I in solid line and Q in dash line.

Note: 1. Ideal curve in solid line.
2. HSPICE simulation in dots.

Note: 1. Ideal curve in solid line.
2. HSPICE simulation in dots.

Note: 1. Ideal curve in solid line.
2. HSPICE simulation in dots.

VERSATILE CHARGE SAMPLING CIRCUITS

CROSS REFERENCE TO RELATED APPLICATIONS

This application is a divisional of U.S. Application Ser. No. 09/672,803, filed Sep. 28, 2000 now U.S. Pat. No. 7,053,673, which claims priority under 35 U.S.C. §§119 and/or 365 to 9903532-1 filed in Sweden on Sep. 28, 1999, which applications are hereby incorporated herein by reference in their entireties.

BACKGROUND

Voltage sampling is traditionally used for analog-to-digital (A/D) conversion. In a voltage sampler, a sampling switch is placed between a signal source and a capacitor. Between two sampling moments, the capacitor voltage tracks the signal voltage accurately. At the sampling moment, the switch is turned off to hold the capacitor voltage. The two processes become increasingly difficult when the signal frequency increases. For a given accuracy, thermal noise and switching noise set a minimum allowable capacitance while the tracking speed set a maximum allowable capacitance or switch resistance. It becomes impossible when the maximum is smaller than the minimum. Moreover, the clock jitter and finite turning-off speed (nonzero sampling aperture) make the sampling timing inaccurate. In fact, the bandwidth of a voltage sampling circuit must be much larger than the signal bandwidth. This makes direct sampling of high frequency radio signal extremely difficult. Sub-sampling can reduce the sampling rate but not the bandwidth of the sampling circuit and not the demands on small clock jitter and small sampling aperture.

SUMMARY

The object of the invention is to provide an improved sampling circuit and a method of sampling an analog signal, which overcomes the above mentioned problems.

In order to achieve said object the invention provides a charge sampling (CS) circuit, comprising a control signal generator for controlling an analog input signal to the charge sampling circuit to be integrated by an intergrator during a sampling phase responsive to a sampling signal from the control signal generator, wherein the current of the analog input signal is integrated to an integrated charge for producing a proportional voltage or current sample at a signal output at the end of the sampling phase.

A more specific object of the invention is to provide a method and sampling circuit for band-pass sampling.

This object is achieved by a band-pass sampling (BPCS) circuit, comprising a control signal generator for controlling a first and second end of a differential analog signal to be weighted by a weighting-and-sampling (W&S) element during a W&S phase responsive to a W&S signal from the control signal generator, wherein the current of the analog signal passes through said W&S element only when said W&S signal is in a W&S phase, and said control signal generator is adapted for controlling the output signal of the W&S element to be integrated by an intergrator during the W&S phase, wherein the current of the output signal of the W&S element is integrated to an integrated charge for producing a proportional voltage or current sample at a signal output at the end of the W&S phase.

Another more specific object of the invention is to provide a two-step BPCS circuit. This is achieved by a two-step BPCS circuit according to the invention, which comprises a first BPCS circuit according to the invention for producing signal samples with a first sample rate; a chopping circuit for chopping the signal from the first BPCS circuit symmetrically in time at its signal output or output pair with the frequency of a clock signal equal to the first sample rate; a differential-out amplifier for amplifying the signal from the chopping circuit differentially; wherein the first signal input and the second signal input of said second BPCS are connected to the signal output pair of said amplifier for producing signal samples at the signal output or output pair with a second sample rate.

A further specific object of the invention is to provide a front-end sampling radio receiver. This is obtained by a front-end sampling radio receiver according to the invention, which comprises a low pass filter with a bandwidth up to twice the clock frequency for receiving and filtering a radio signal; a low noise amplifier for producing a differentially amplified radio signal from the filtered signal; a local oscillator for producing an I-clock signal at its signal output; a $\pi/2$ phase shifter with a signal input connected to the local oscillator for producing a Q-clock signal at its signal output with the same amplitude and $\pi/2$ phase shift with respect to the I-clock signal; wherein two ends of the signal output pair of said low noise amplifier are respectively connected both to the first BPCS circuit and the second BPCS circuit respectively, said I-clock signal output is connected to the clock input of said first BPCS circuit, and the Q-clock signal output is connected to the clock input of the second BPCS circuit, for producing base-band I-samples of the radio signal at the signal output or output pair of the first BPCS circuit, base-band Q samples of the radio signal at the signal output or output pair of said second BPCS circuit.

An advantage of the charge sampling, circuit according to the invention is that the bandwidth of the charge sampling circuit does not have to be much larger than the signal bandwidth. It is also important that for a radio signal, no matter how high the carrier frequency is, the signal bandwidth (the base band) remains a small fraction of the full bandwidth between DC and the carrier frequency. It is therefore unnecessary to convert the full bandwidth. Instead, it is only necessary to convert the bandwidth comprising the signal.

The frequencies of the signals possibly to be sampled by the CS circuits or the BPCS circuits are higher or much higher than that of the voltage sampling circuits at a given accuracy.

The sampling capacitors used in the CS circuits or the BPCS circuits are larger or much larger than the ones used in the voltage sampling circuits, giving advantages of low noise and low clock-and-charge feed-through.

Each BPCS circuit is simultaneously a filter, a mixer and a sampler, which greatly simplifies a radio receiver.

The BPCS circuits are capable of directly working at the radio frequency band, which makes a highly digitized radio receiver with front-end sampling and A/D conversion possible.

Both the center frequency and the bandwidth of a BPCS circuit can be easily programmed. The bandwidth can be as narrow as required; equivalent to having an unlimited Q-value.

The CS and BPCS circuits are simple and can be easily implemented in CMOS or other processes.

This technique is very useful for the purpose of system-on-chip, which requires a simple and highly digitized architecture.

It should be emphasised that the term "comprises/comprising" when used in this specification is taken to specify the presence of stated features, integers, steps or components and does not preclude the presence or addition of one or more other features, integers, steps, components or groups thereof.

BRIEF DESCRIPTION OF THE DRAWINGS

In order to explain the invention in more detail and the advantages and features of the invention a preferred embodiment will be described in detail below, reference being made to the accompanying drawings, in which.

DETAILED DESCRIPTION

The present invention is a charge sampling (CS) circuit or a band-pass charge sampling (BPCS) circuit, sampling a signal by integrating its current in a given time window, and the resulting charge represents the signal sample at the center time of the window.

Figure 1A:
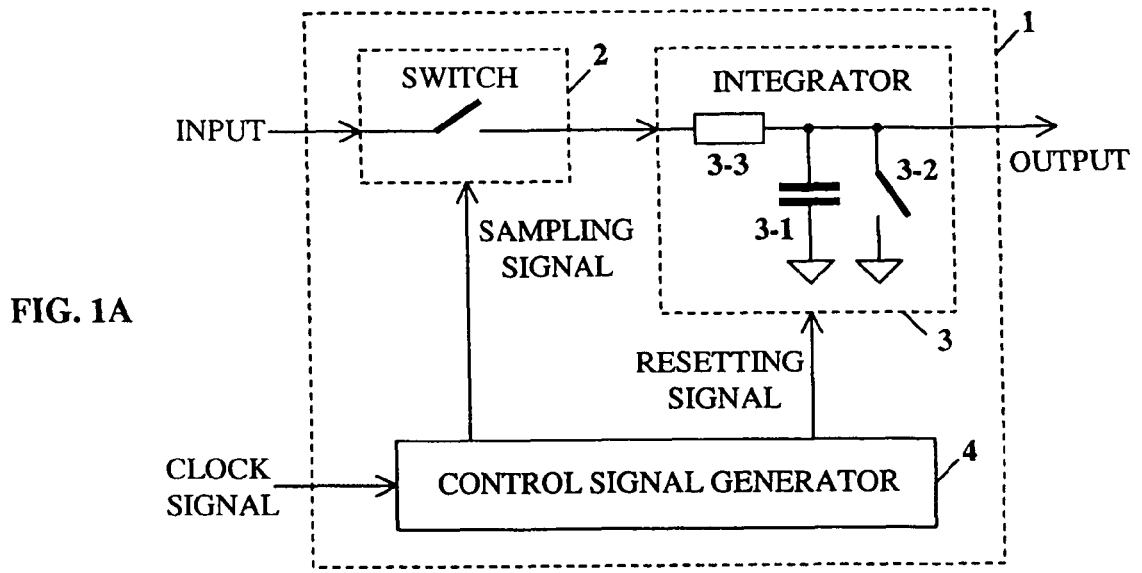
FIG. 1A is a block diagram of a first embodiment of a charge sampling (CS) circuit according to the invention.

With reference to FIG. 1A, a first embodiment of a charge sampling (CS) circuit 1 according to the invention is shown. It comprises sampling switch 2, an integrator 3 and a control signal generator 4. The switch 2 has a signal input, a signal output and a control input. An analog signal is applied to the signal input of the switch, which is the signal input of the charge sampling circuit 1, and a sampling signal is applied to the control input from the control, signal generator 4. The switch is on, i.e., the signal input is connected to the signal output of the switch, only when the sampling signal is in the sampling phase. The integrator 3 has a signal input, a signal output, and a control input. The signal output of the switch 2 is applied to the signal input of the integrator 3, and a resetting signal from the control signal generator 4 is applied to the control input of the integrator 3. The current of the analog input signal to the CS circuit is integrated during the sampling phase, and the integrated charge produces a proportional voltage or current sample at the signal output of the CS circuit at the end of the sampling phase. The sample is held until the resetting phase of the resetting signal begins, and the time interval in between is the holding phase. A sequence of samples are produced when the phases are repeated, and the signal output is the signal output of said CS circuit. The control signal generator 4 has a clock input, which is the clock input of the CS circuit, a sampling signal output connected to the control input of the switch 2 and a resetting signal output connected to the control input of the integrator 3 as mentioned above.

Figure 1B:
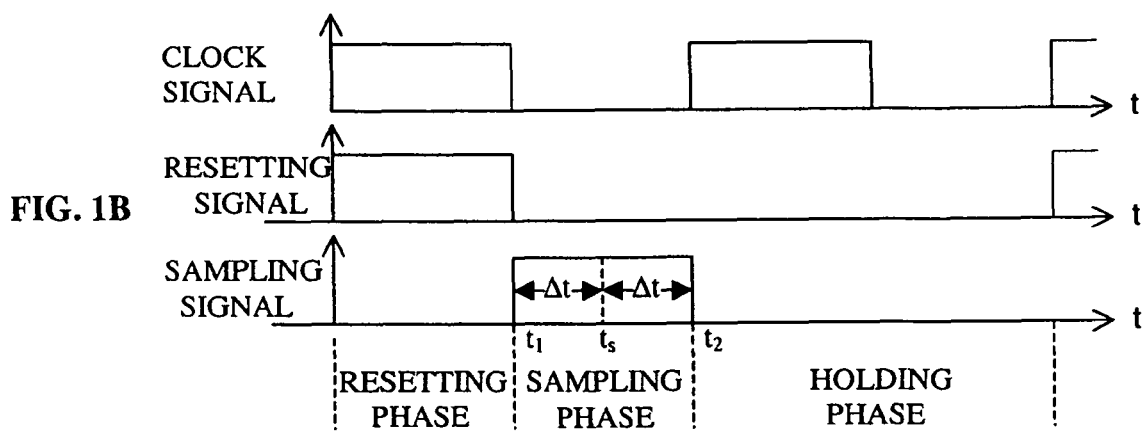
FIG. 1B shows the working waveforms of the charge sampling (CS) circuit in FIG. 1A.

The integrator 3 comprises a capacitor 3-1, a resetting switch 3-2 and an optional resistor 3-3 in this embodiment. The integrator 3 can, however, have a different configuration in other embodiments. An analog signal is applied to the input of the sampling switch 2. As described, the charge sampling process involves three successive phases: resetting, sampling ($t_1$ to $t_2$) and holding. The time from $t_1$ to $t_2$ is defined as the sampling window. FIG. 1B shows its working waveforms. During the resetting phase, only the resetting switch 3-2 is turned on and the capacitor 3-1 is reset. During the sampling phase, only the sampling switch 2 is turned on, and the signal current is integrated onto the capacitor 3-1. The time constant is large enough to be able to obtain a linear charging when the signal comes from a voltage source (the usual case). If the on-resistance of the switch 2 is too small, the optional resistor 3-3 can be added. During the holding phase, both switches are in off-state, and the output voltage of the integrator 3 is held for further use. A pair of interconnected CS circuits, forming a differential CS circuit, provide differential outputs to cancel common mode effects, using a differential input signal and sharing the control signal generator 4. The CS circuits or circuit pairs are used in parallel to increase the sampling rate and to make the time interval between two sampling points possibly less than the sampling window, by time-interleaving both sampling and resetting signals. The signal current can be represented as $I(t)=\Sigma I_i \sin(\omega_i t+\phi_i)$, i=1, 2, ..., m. The total integrated charge is $Q=\Sigma Q_i$ where $Q_i=(I_i/\omega_i)(\cos(\omega_i t_1+\phi_i)-\cos(\omega_{i2}+\phi_i))$. If $t_s$ is the center time of the sampling window, and $2\Delta t=(t_2-t_1)$ is the window width, $Q_i=(2 \sin(\omega_i \Delta t/\omega_i) I_i \sin(\omega_i t_s+\phi_i)=2\Delta t(\sin(\omega_i \Delta t) I_i \sin(\omega_i t_s+\phi_i)$.

Figure 1C:
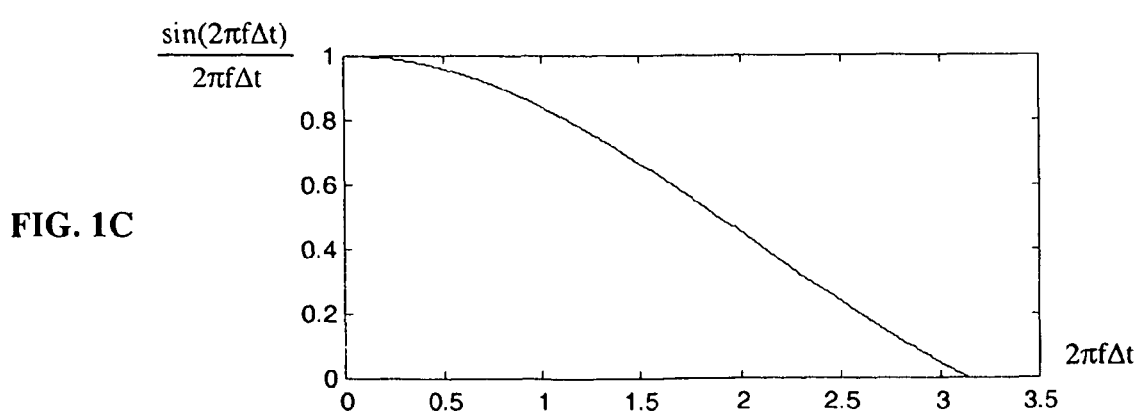
FIG. 1C shows the frequency response of the charge sampling (CS) circuit in FIG. 1A.

Compared with the instant value of the ith component at $t_s$. $I_i(t_s)=I_i \sin(\omega_i \Delta t_s+\phi_i)$, the difference is $k_i=2\Delta t(\sin(\omega_i \Delta t/\omega_i \Delta t))$, a sampling coefficient depending on frequency $\omega_i$ and $\Delta t$. With this coefficient, the ith frequency component has been precisely sampled at time $t_s$. Since all frequency components are sampled at $t_s$, the total charge on the capacitor naturally represents the signal sample at $t_s$, i.e. $t_s$ is the equivalent sampling time point. The frequency response of the CS circuit depends on the function $\sin(\omega_i \Delta t/\omega_i \Delta t)$, shown in FIG. 1C. Its 3 dB bandwidth equals $\Delta f_{3\,dB}=1.4/(2\pi\Delta t)$, i.e. 1 GHz for a sampling window of 450 ps, independent of resolution. For voltage sampling, however, the sampling aperture must be smaller than 1 ps for an 8-bit resolution at 1 GHz. Since the function $\sin((\omega_i \Delta t/\omega_i \Delta t)$ is well defined, frequency compensation becomes possible. One way is to let the analog signal pass through a network with a frequency response of $(\omega_i \Delta t)/\sin(\omega_i \Delta t)$ before sampling. Another alternative is to use digital signal processing (DSP) after A/D conversion to compensate the frequency response.

Further, a band pass charge sampling (BPCS) circuit comprises two switches, a weighting-and-sampling (W&S) element, an integrator, and a control signal generator generating a clock, an inverse clock, a W&S signal and a resetting signal. Two ends of a differential signal are applied to the two switch inputs respectively. The two switches, controlled by the clock and the inverse clock respectively, are turned on alternately. Both switch outputs are fed to the W&S element input. The output of W&S element is fed to the integrator input. It works in three successive phases: resetting, sampling and holding. During the resetting phase, the integrator is reset by the resetting signal. Each sampling phase includes n clock cycles, during which the signal current is weighted in the W&S element and integrated in the integrator. During the holding phase, the integrator output is held.

Figure 2A:
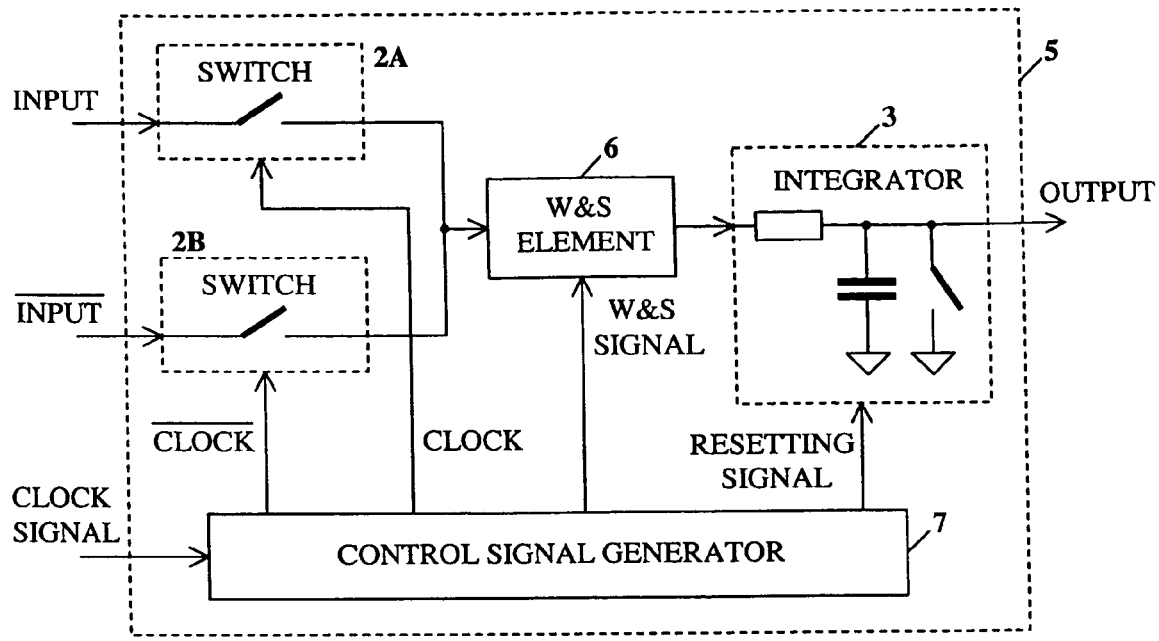
FIG. 2A is a block diagram of a first embodiment of a a band pass charge sampling (BPCS) circuit according to the invention.
Figure 2B:
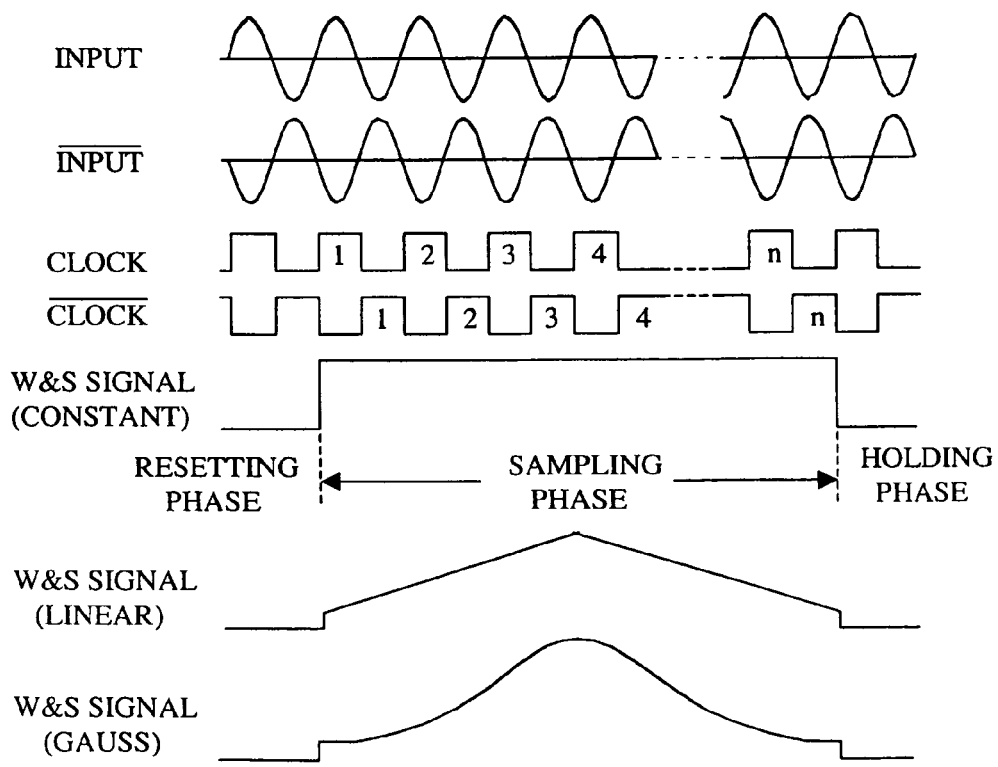
FIG. 2B shows the working waveforms of the band pass charge sampling (BPCS) circuit in FIG. 2A.

One embodiment of a band-pass charge sampling (BPCS) circuit 5 is shown in FIG. 2A. It comprises two switches 2A and 2B, a weighting-and-sampling (W&S) element 6, an integrator 3 and a control signal generator 7 generating a clock, an inverse clock, a W&S signal and a resetting signal. Two ends of a differential analog signal are applied to the inputs of switches 2A and 2B respectively. The switches 2A and 2B, controlled by the clock and the inverse clock respectively, are turned on alternately. Both outputs of switch 2A and 2B are fed to the input of W&S element 6. The current passing through the W&S element 6 is controlled by the W&S signal. The output of W&S element 6 is fed to the input of integrator 3. Three successive phases are involved for each BPCS process: resetting, sampling and holding. FIG. 2B shows the working waveforms. During the resetting phase, the integrator is reset. Each sampling phase includes n clock cycles forming a sampling window. The signal current through W&S element equals zero outside the sampling window and is weighted according to the weighting function (constant, linear, Gauss or other fuctions) within the sampling window. The weighting function depends on the combination of the W&S element 6 and the W&S signal. The three W&S signals shown in FIG. 2B, corresponding to the three weighting functions (constant, linear and Gauss) are specifically used for a W&S element in which the current is linearly controlled by the W&S signal. During the holding phase, the output voltage of integrator 3 is held for further use.

Figure 3:
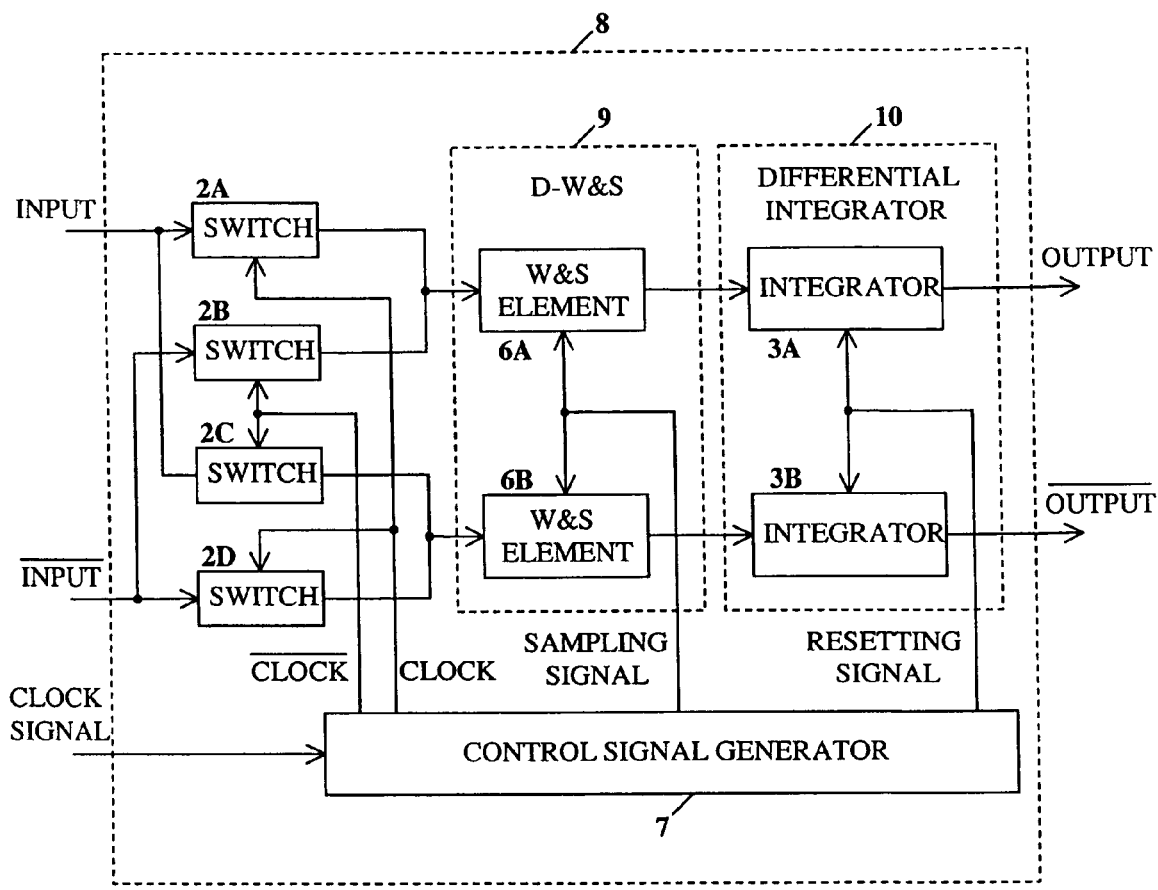
FIG. 3 is a block diagram of a first embodiment of a differential BPCS circuit according to the invention.

A differential BPCS circuit 8 is shown in FIG. 3. It comprises four switches 2A, 2B, 2C and 2D, a differential W&S (D-W&S) element 9, a differential integrator 10, and a control signal generator 7, as connected. The shown type of D-W&S element 9 comprises two parallel W&S elements 6A and 6B, and the shown type of differential integrator comprises two parallel integrators 3A and 3B. The D-W&S element 9 and the differential integrator 10 may be in other types. The differential BPCS circuit 8 works in the same way as the single ended BPCS circuit 5 except to produce two outputs differentially. The differential BPCS circuit 8 effectively cancels the common mode effects and gives more accurate results.

Figure 4:
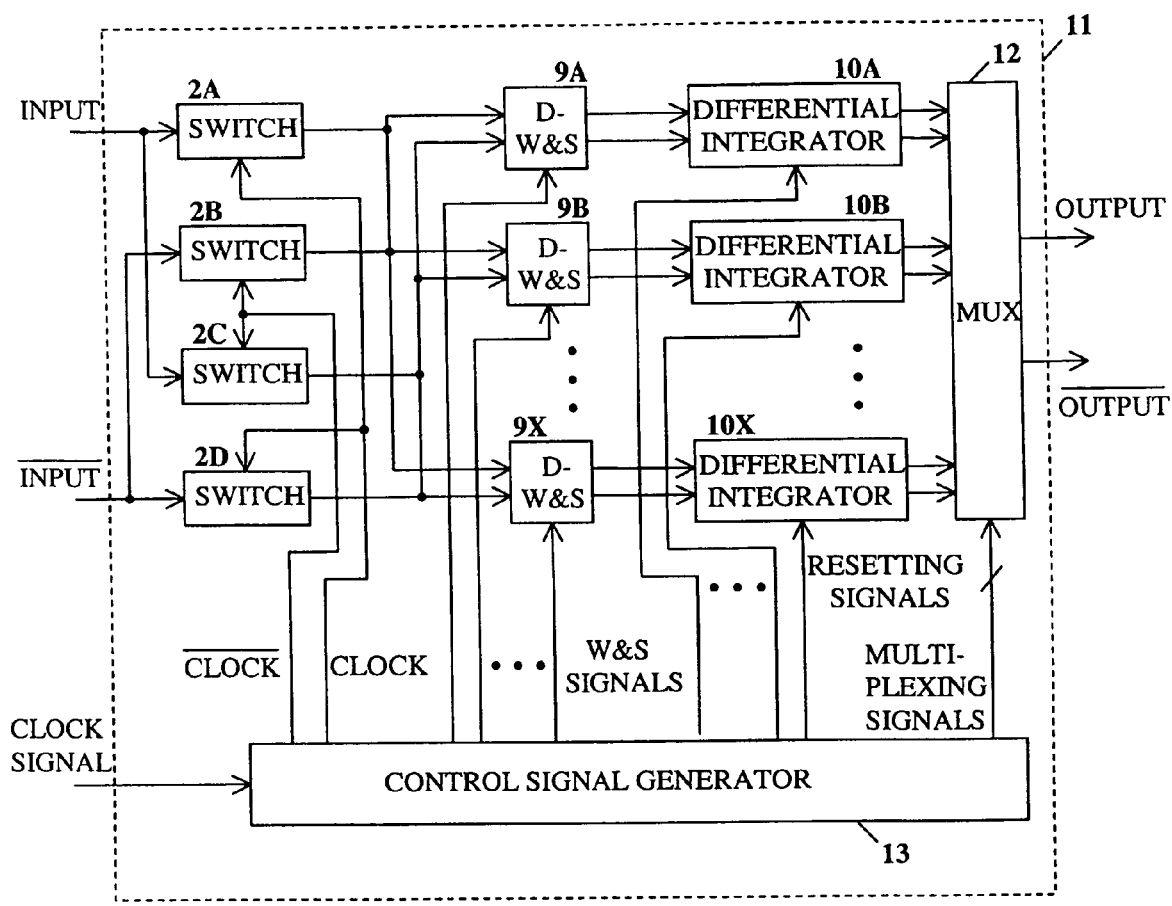
FIG. 4 is a block diagram of a first embodiment of a parallel differential BPCS circuit according to the invention

FIG. 4 shows a parallel differential BPCS circuit 11. It comprises four switches 2A, 2B, 2C and 2D, a number of D-W&S elements 9A, 9B, ..., 9X, a number of differential integrators 10A, 10B, ..., 10X, a multiplexer (MUX) 12 and a control signal generator 13, as connected. Each pair of the D-W&S element and the differential integrator, 9A+10A, 9B+10B, ..., 9X+10X, together with the switches 2A, 2B, 2C and 2D work in the same way as the differential BPCS circuit 8. The W&S signals and the resetting signals to these pairs, generated by the control signal generator 13, are evenly time-interleaved. The MUX 12 multiplexes the outputs of the differential integrators 10A, 10B, ..., 10X to the differential outputs when they are in the holding phase, controlled by the multiplexing signals from the control signal generator 13. As a whole, the parallel BPCS circuit gives a higher sampling rate and makes the time interval between two successive sampling points possibly less than the sampling window. If switches 2C and 2D are removed, and the differential W&S elements and the differential integrators are replaced by single-ended versions, it becomes a parallel single-ended BPCS circuit.

Figure 5:
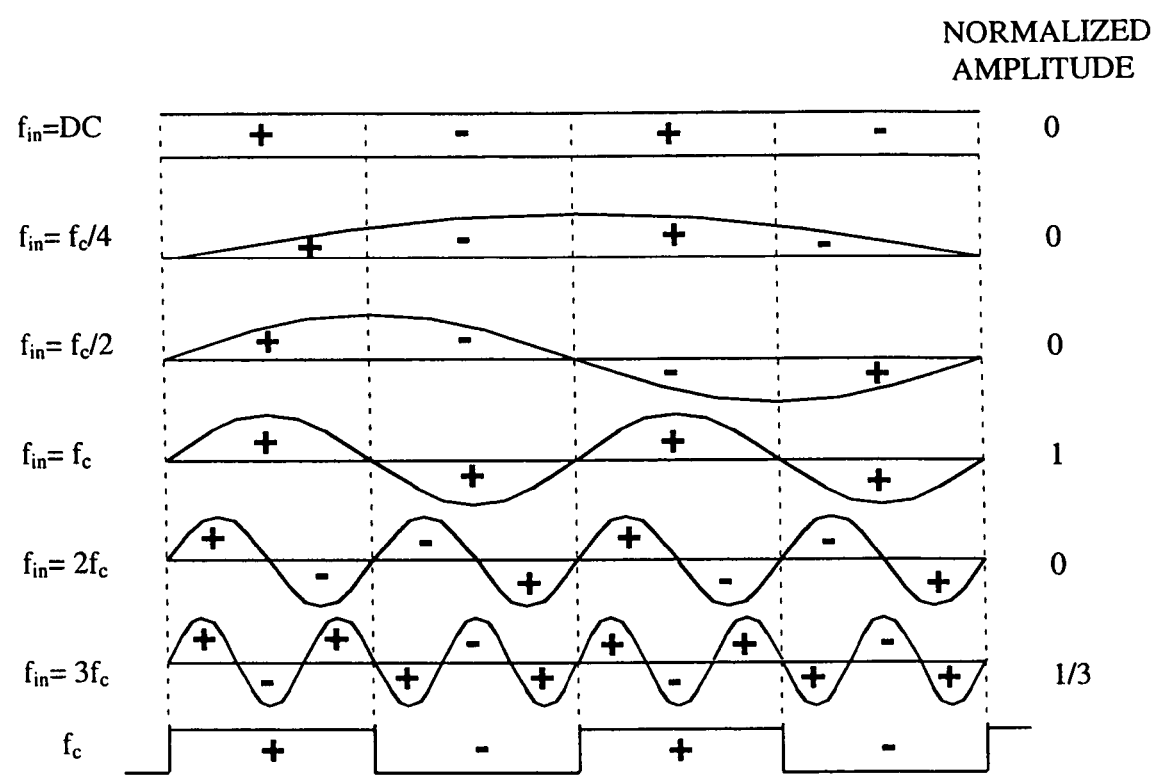
FIG. 5 shows an illustration of the filter function for the BPCS circuits according to the invention

A filter function of the BPCS circuits is illustrated in FIG. 5. From top-down, the frequency increases from DC to $3f_c$, where $f_c$ is the clock frequency. Note that during the negative clock phase the same signal is connected oppositely, which is reflected in the diagram by changing the signal sign. The normalized amplitudes of resulting charges, i.e. the sums of the areas, integrated in n clock cycles are listed in FIG. 5 respectively. It is obvious that for input signals with frequencies much higher or lower than $f_c$, the charges cancel each other almost completely, resulting in nearly zero output. For input signals with certain frequencies like $f_c/4, f_c/2, 2f_c, \ldots$, the charges are completely cancelled no matter what their phases are. For input signals with frequencies near to $f_c$, the charges are only partly cancelled. When $f_{in}=f_c$, the charges are fully added to each other if it is in-phase with $f_c$ while fully cancelled when it is in $\pi/2$ phase with $f_c$ (not shown in FIG. 5). There is a bandwidth in which the signal charges can be effectively integrated. Outside the band-width, the signal charges are either completely or substantially cancelled. This is obviously a filter function. It means that the noise with frequencies outside the bandwidth will be cancelled as well.

Figure 6A:
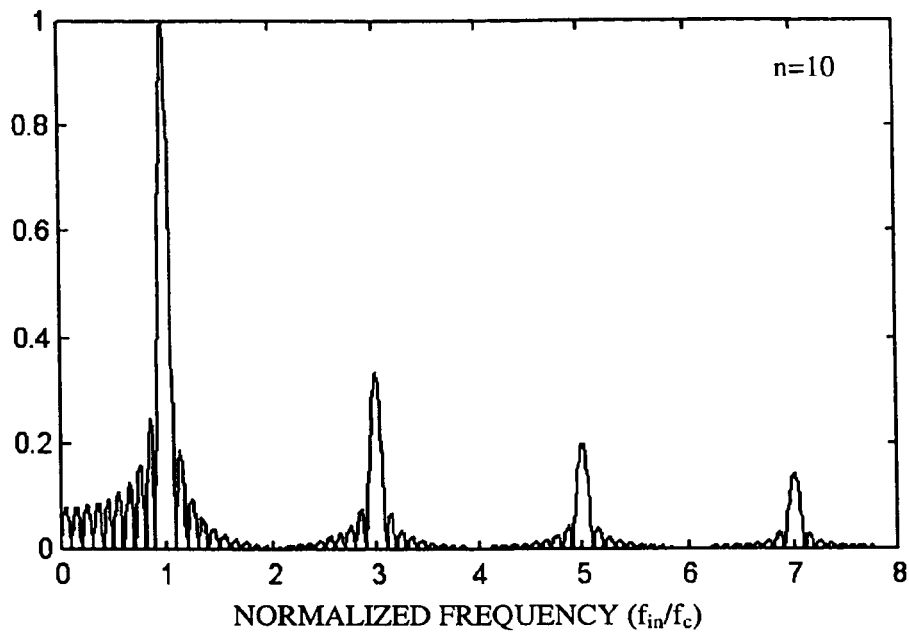
FIG. 6A is the ideal frequency response of a constant-weighting BPCS circuit according to the invention with n=10.
Figure 6B:
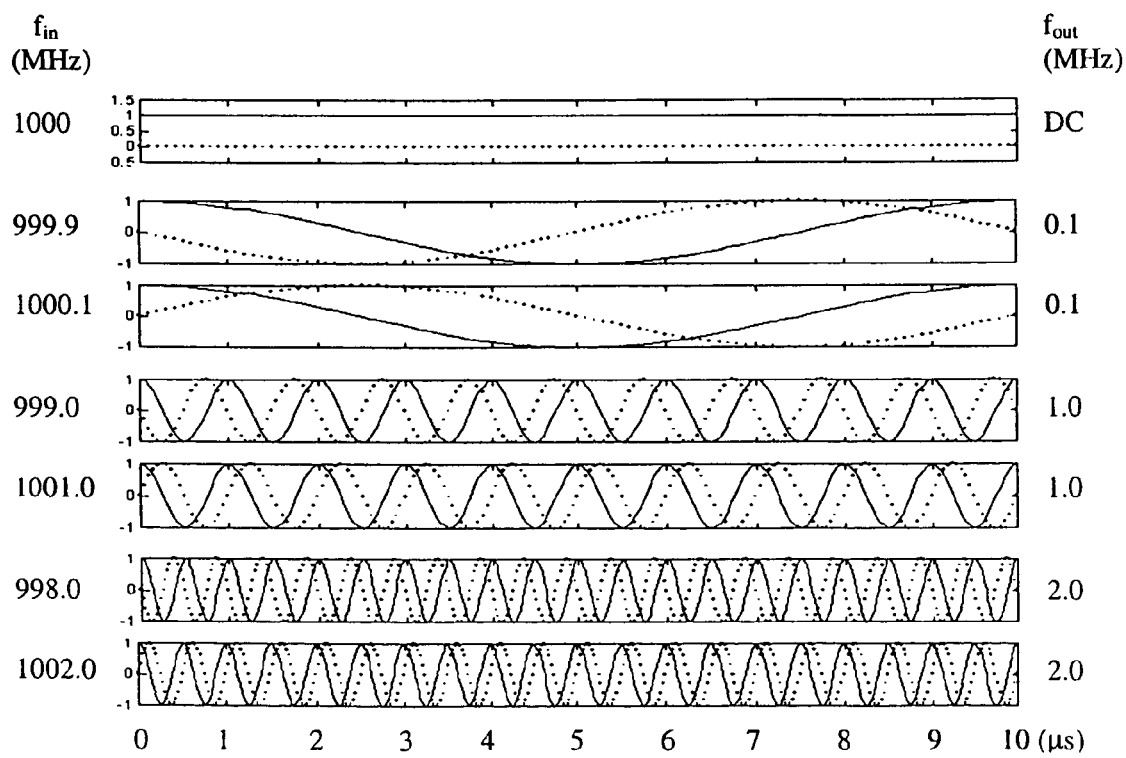
FIG. 6B is the output sample waveforms of a constant-weighting BPCS circuit with n=10.

An ideal frequency response of a BPCS circuit is shown in FIG. 6A, which corresponds to a mathematically accurate integration of the signal current in the sampling window. In FIG. 6A, n=10 and constant-weighting are assumed, meaning that the weight of the current is kept constant in the 10-clock-cycle sampling window. Further, FIG. 6A shows the frequency response from $f_{in}=0$ to $f_{in}=8f_c$, where the y-axis is the maximum output amplitude of different frequency components normalized by the maximum output amplitude in the whole frequency range while the x-axis is input frequencies normalized by $f_c$. It can be seen that the same frequency response is repeated after $f_{in}>2f_c$ but with lower amplitudes. The output frequency $f_{out}$ equals $|f_{in}-(2p-1)f_c|$ for $2(p-1)f_c \leq f_{in} \leq 2pf_c$, where p is an integer ($\geq 1$). When $f_{in}=(2p-1)f_c$, the output is a DC voltage, and its amplitude depends on the phase relation of $f_{in}$ and $f_c$. For a given p, the same output frequency is obtained for input frequencies $f_{in1}$ ($<(2p-1)f_c$) and $f_{in2}$ ($>(2p-1)f_c$) when $(2p-1)f_c-f_{in1}=f_{in2}-(2p-1)f_c$, but their phases are different. FIG. 6B shows the output sample waveforms at different input frequencies with $f_c=1000$ MHz and both I (solid line) and Q (dots) phases. It shows that the BPCS circuit is a filter, a mixer and a sampler simultaneously.

Figure 7A:
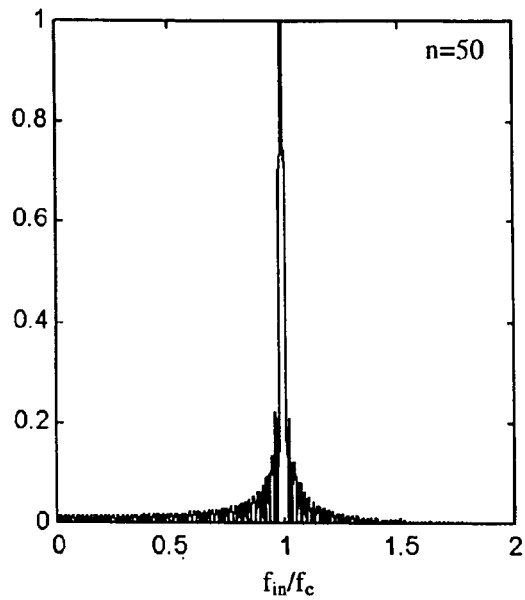
FIG. 7A is the ideal frequency responses of a constant-weighting BPCS circuit with n=50.
Figure 7A:
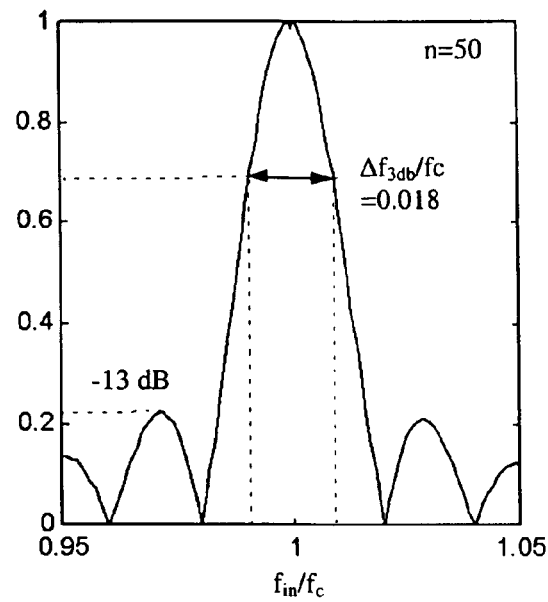
Figure 7B:
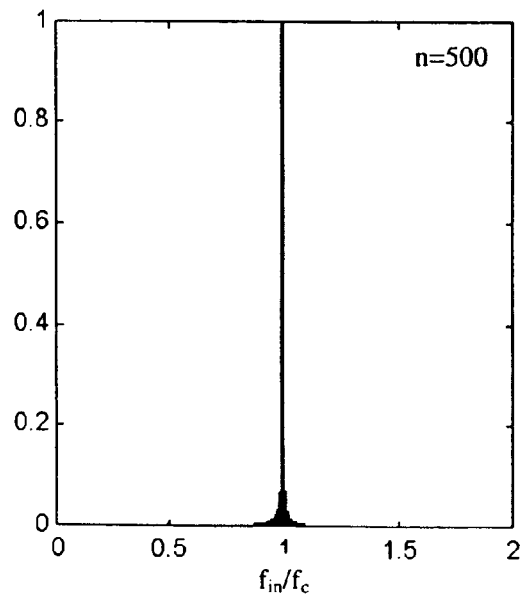
FIG. 7B is the ideal frequency responses of a constant-weighting BPCS circuit with n=500.
Figure 7B:
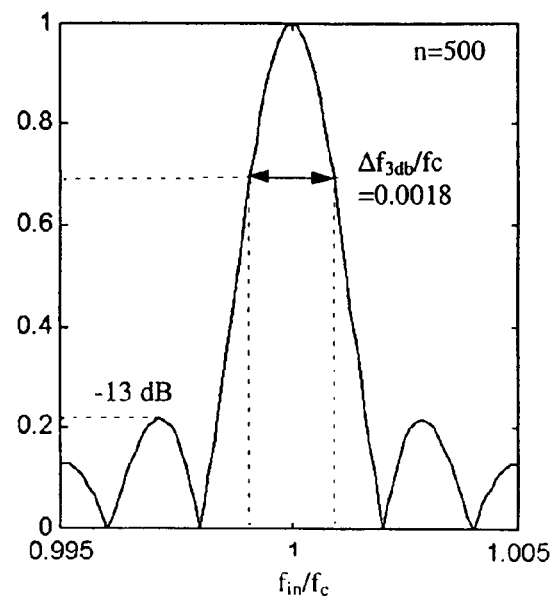

In FIG. 7A and FIG. 7B, the ideal frequency responses of a constant-weighting BPCS circuit with n=50 and n=500 are shown respectively. FIG. 7A shows the frequency response with n=50 in the range of $0<f_{in}<2f_c$, and in the fine range of a $0.95f_c<f_{in}<1.05f_c$. FIG. 7B shows the frequency response with n=500 in the range of $0<f_{in}<2f_c$ and in the fine range of $0.995f_c<f_{in}<1.005f_c$. It can be seen that $\Delta f_{3dB}=0.018\,f_c$ with n=50 and $\Delta f_{3dB}=0.0018f_c$ with n=500, i.e. the bandwidth is inversely proportional to n. The amplitudes of far-end frequency components are reduced with the increase of n, but the maximum adjacent peaks in both cases remain almost unchanged; around −13 dB.

Figure 8A:
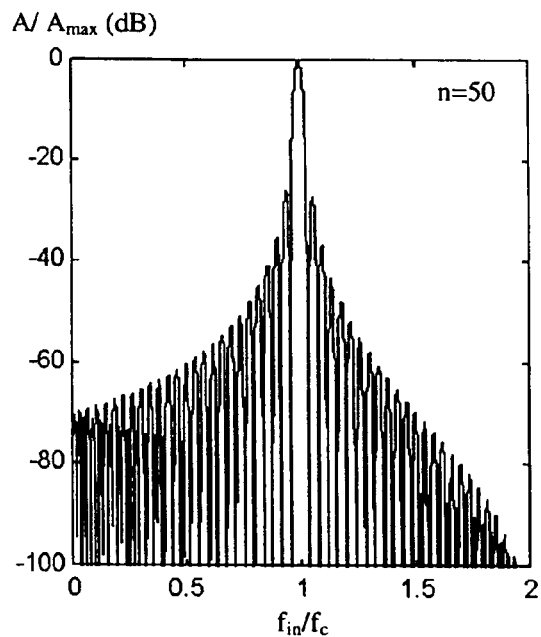
FIG. 8A is the ideal frequency responses of a linear-weighting BPCS circuit with n=50.
Figure 8A:
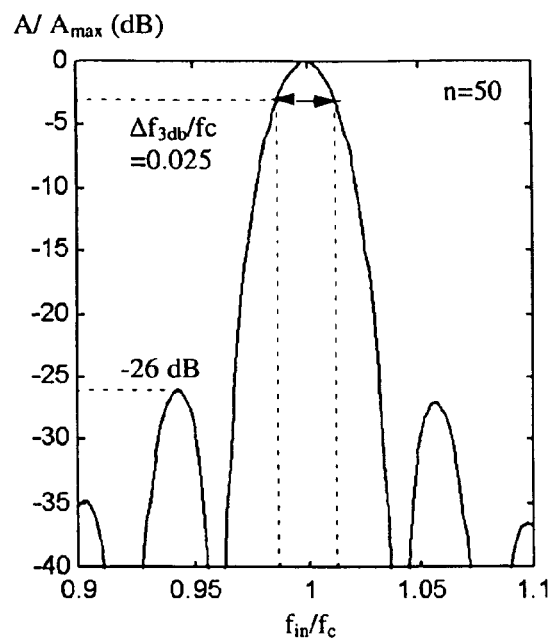
Figure 8B:
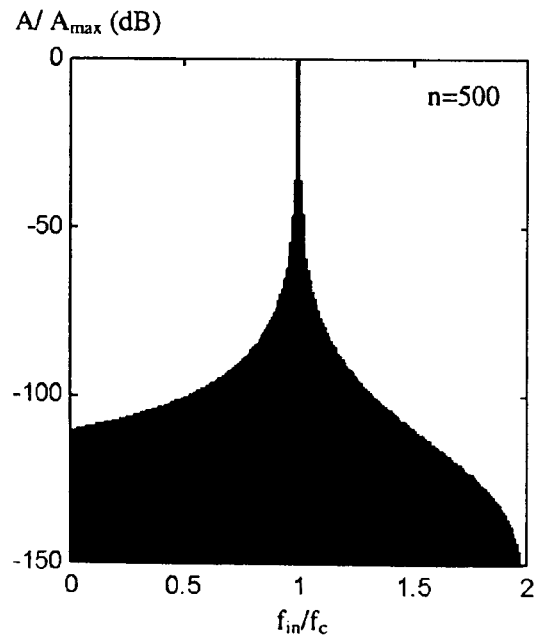
FIG. 8B is the ideal frequency responses of a linear-weighting BPCS circuit with n=500.
Figure 8B:
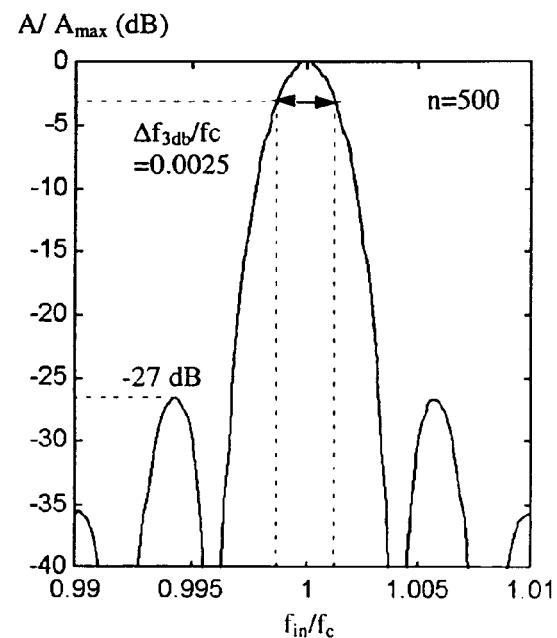

Ideal frequency responses of a linear-weighting BPCS circuit with n=50 and n=500 are shown in FIG. 8A and FIG. 8B, respectively. Linear-weighting means that during the sampling phase the weight of the current is first linearly increased and then linearly decreased, symmetric to the center of the sampling window. FIG. 8A shows the frequency response with n=50 in the range of $0<f_{in}<2f_c$ and in the fine range of $0.9f_c<f_{in}<1.1f_c$. FIG. 8E shows the frequency response with n=500 in the range of $0<f_{in}<2f_c$ and in the fine range of $0.99f_c<f_{in}<1.01f_c$. It can be seen that $\Delta f_{3dB}=0.025\,f_c$ with n=50 and $\Delta f_{3dB}=0.0025\,f_c$ with n-500, slightly increasing compared to the constant-weighting cases. The amplitudes of far-end frequency components are rapidly reduced with the increase of n. The maximum adjacent peaks are reduced to −26 dB and −27 dB respectively, compared to those of the constant-weighting cases.

Figure 9A:
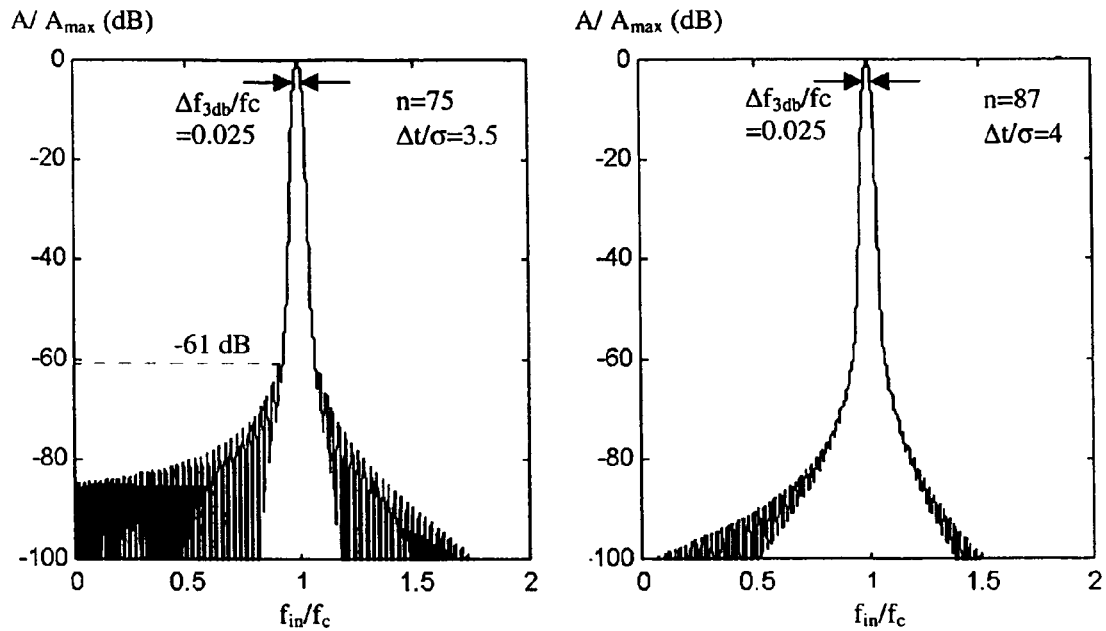
FIG. 9A is the ideal frequency responses of a Gauss-weighting BPCS circuit with n=75 and n=87.
Figure 9B:
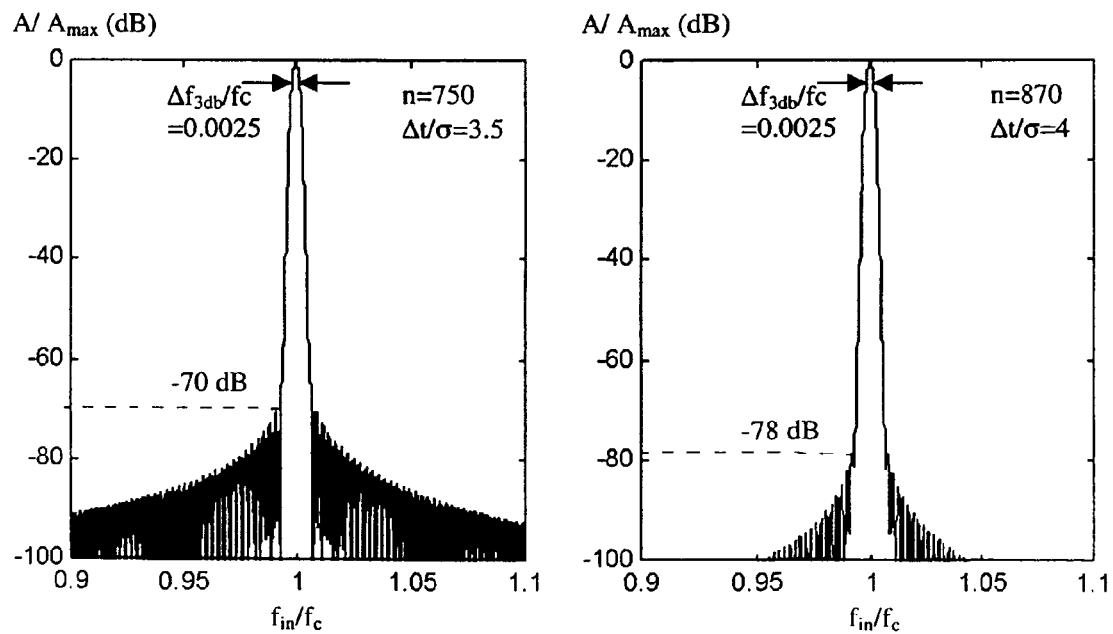
FIG. 9B is the ideal frequency responses of a Gauss-weighting BPCS circuit with n=750 and n=870.

In FIG. 9A and FIG. 9B, the ideal frequency responses of a Gauss-weighting BPCS circuit are shown. Gauss-weighting means that during the sampling phase the weight of the current varies according to the Gauss function $\exp(-t^2/2\sigma^2)$ for a given c, symmetric to the center of the sampling window. The ratio $\Delta t/\sigma$, where $\Delta t$ is half of the sampling window and $\sigma$ the standard deviation, is a weighting parameter. FIG. 9A shows the frequency responses of n=75 with $\Delta t/\sigma=3.5$ and n=87 with $\Delta t/\sigma=4$ respectively in the range of $0<f_{in}<2f_c$. The 3 dB bandwidths are both $0.025f_c$. FIG. 9B shows the frequency responses of n=750 with $\Delta t/\sigma=3.5$ and n=870 with $\Delta t/\sigma=4$ respectively in the range of $0.9f_c<f_{in}<1.1\,f_c$. The 3 dB bandwidths are both $0.0025f_c$. The amplitudes of far-end frequency components and the adjacent peaks are substantially reduced with the Gauss-weighting. The maximum adjacent peaks are in the range of −61 dB to −78 dB.

Figure 10:
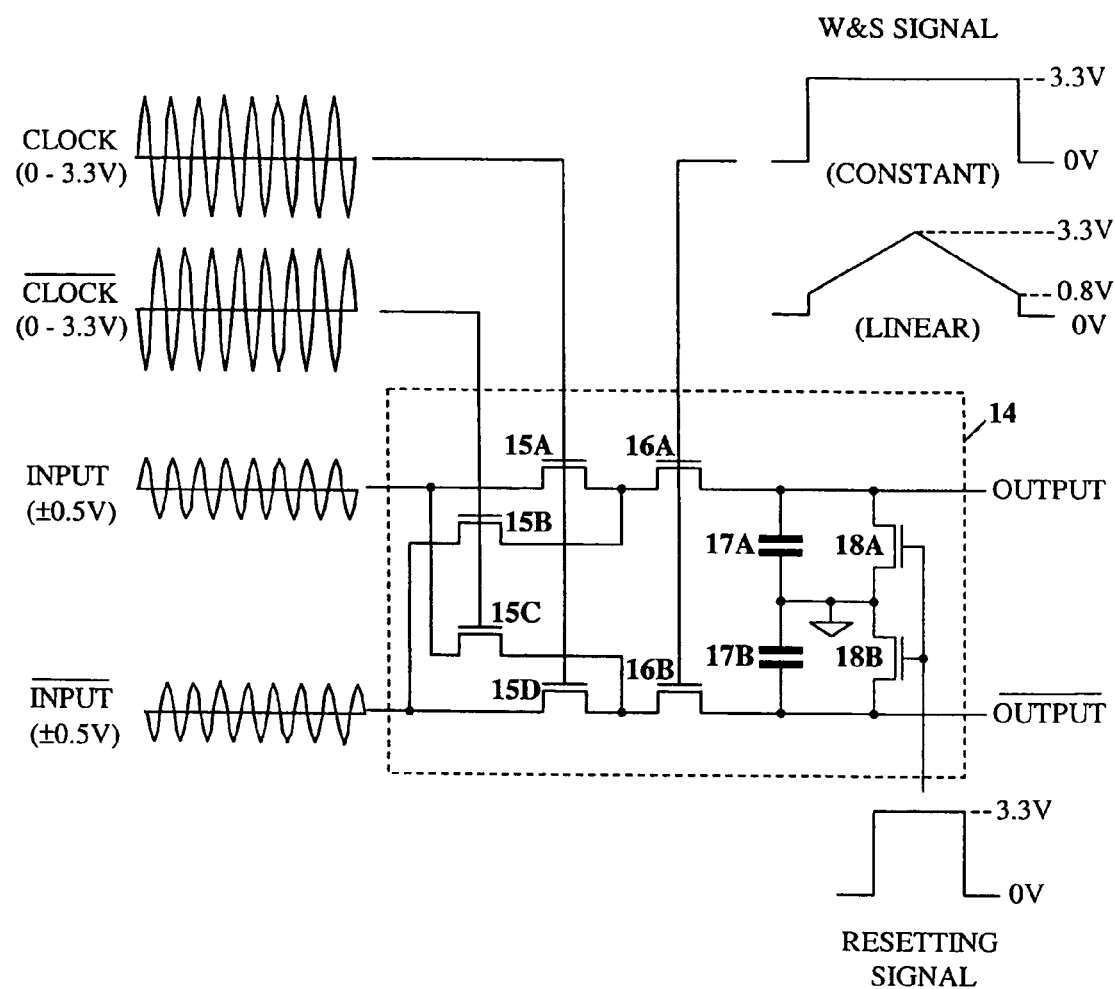
FIG. 10 is a circuit diagram of the first embodiment of the differential BPCS circuit in FIG. 3.

An implementation 14 of the core of the differential BPCS circuit 8, using n-MOS transistors, is shown in FIG. 10. The clocked switches are n-MOS transistors 15A, 15B, 15C and 15D. The W&S elements are n-MOS transistors 16A and 16B. The resetting switches are n-MOS transistors 18A and 18B. The capacitors are on-chip MOS capacitors 17A and 17B. The clocks are in sinuous waves but quasi-square waves can also be used. The implementation 14 works in all CMOS processes. Parameters of a 0.8 μm CMOS process, however, is used in the HSPICE simulations. The following three implementations are based on the implementation 14 with particular component values and W&S signal parameters.

Figure 11A:
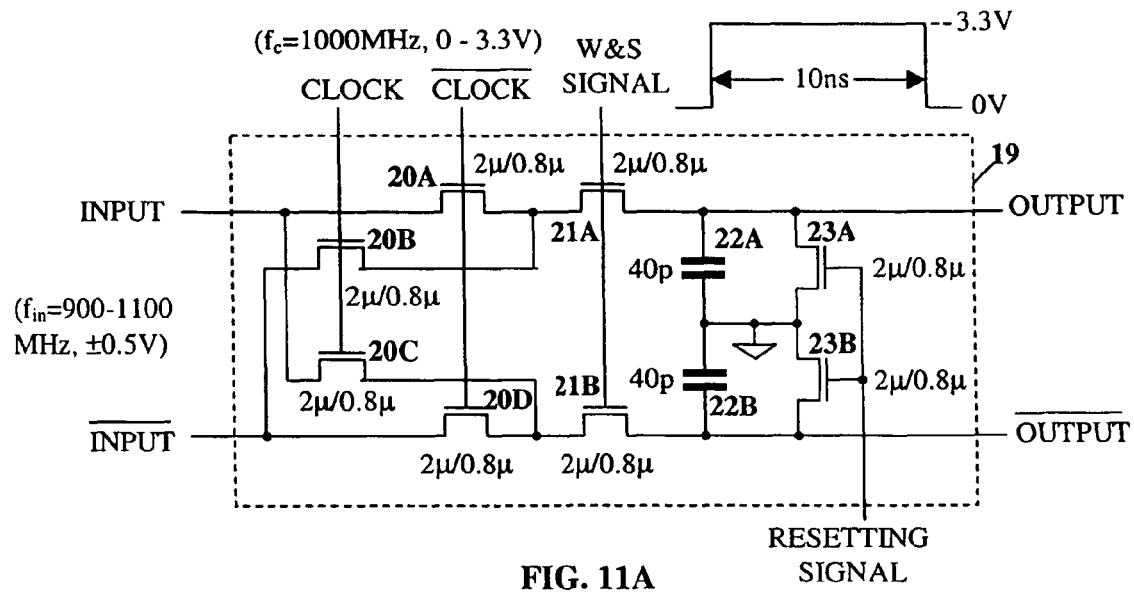
FIG. 11A shows the circuit diagram according to FIG. 10 with n=10 in constant weighting at 1000 MHz
Figure 11B:
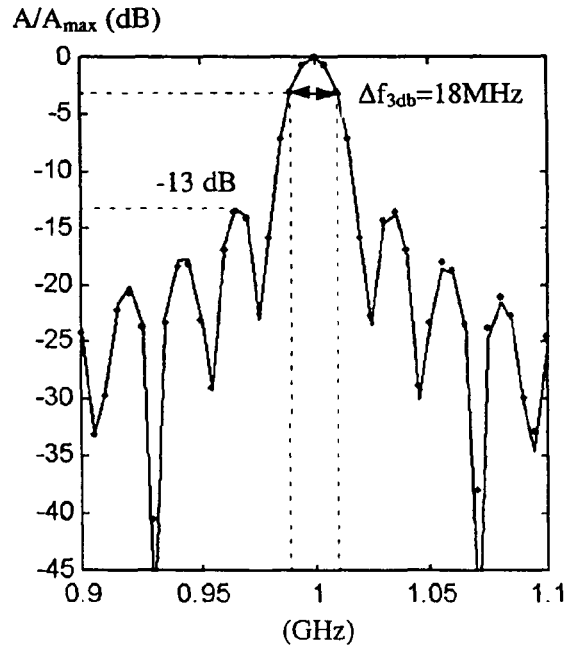
FIG. 11B shows the resulting frequency response of the circuit in FIG. 11A.

An implementation 19 with n=10 in constant-weighting at $f_c$=1000 MHz is shown in FIG. 11A. The clocked switches are n-MOS transistors 20A, 20B, 20C and 20D. The W&S elements are n-MOS transistors 21A and 21B. The resetting switches are n-MOS transistors 23A and 23B. They all have the minimum size, 2 μm/0.8 μm (width/length). The capacitors are MOS capacitors 22A and 22B, both 40 pF. The width of the constant-weighting W&S signal is 10 ns, corresponding to n=10. The maximum differential output sample voltage is around 100 mV. FIG. 11B shows both the theoretical frequency response in solid line and the HSPICE simulated frequency response in dots for $f_{in}$=900-1100 MHz. The simulated frequency response is closely in accordance with the theoretical frequency response. In both cases, the maximum adjacent peaks are −13 dB and $\Delta f_{3dB}$=18 MHz.

Figure 12A:
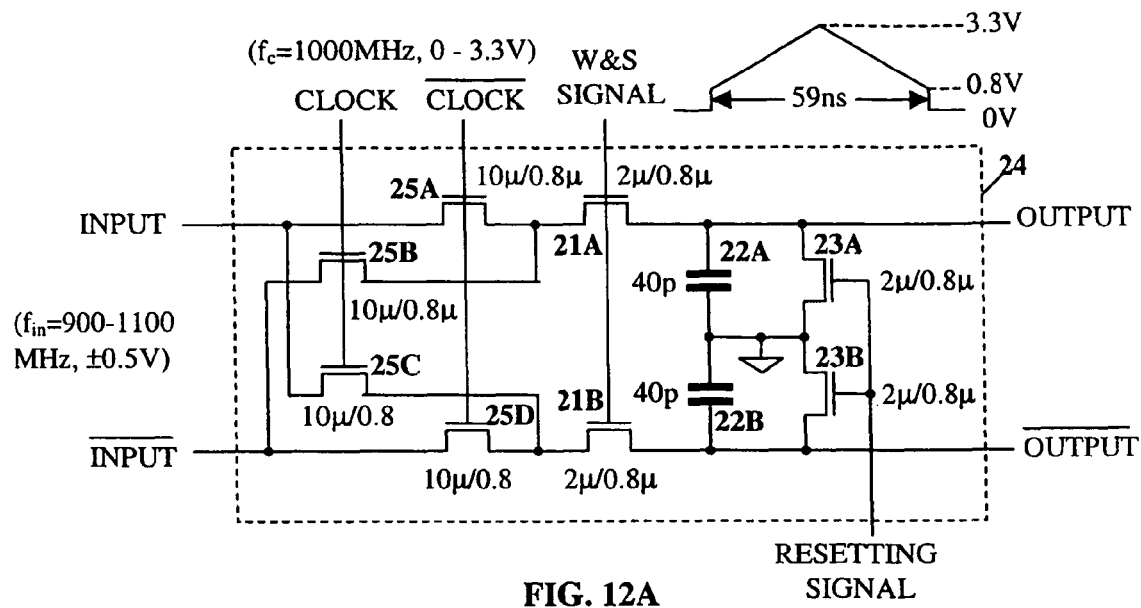
FIG. 12A is the circuit diagram according to FIG. 10 with n=59 in linear weighting at 1000 MHz.
Figure 12B:
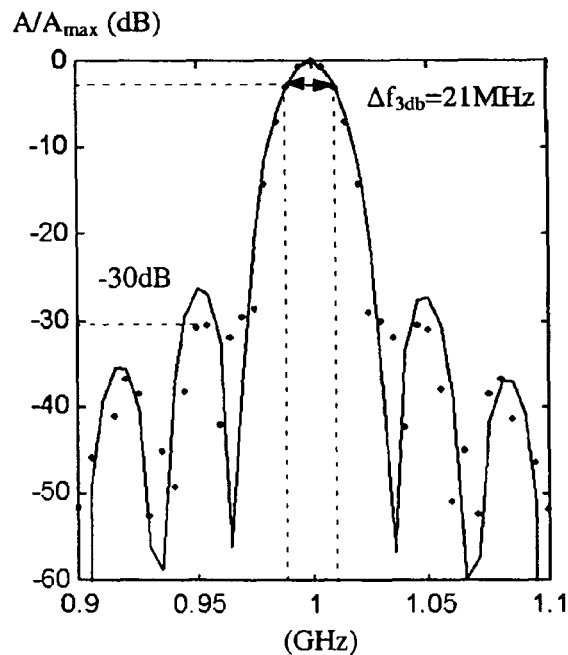
FIG. 12B is the resulting frequency response of the the circuit in FIG. 12A.

In FIG. 12A, an implementation 24 with n=59 in linear-weighting at $f_c$=1000 MHz is shown. The clocked switches are n-MOS transistors 25A, 25B, 25C and 25D, all having an increased size of 10 μm/0.8 μm. This makes the signal currents dominated by the W&S elements not the switches. The W&S elements are n-MOS transistors 21A and 21B, 2 μm/0.8 μm. The resetting switches are n-MOS transistors 23A and 23B, 2 μm/0.8 μm. The capacitors are MOS capacitors 22A and 22B, both 40 pF. The width of the linear-weighting W&S signal is 59 ns, corresponding to n=59. The maximum differential output sample voltage is around 100 mV. FIG. 12B shows the theoretical frequency response in solid line and the HSPICE simulated frequency response in dots for $f_{in}$=900-1100 MHz. The simulated frequency response is basically in accordance with the theoretical frequency response. Both have $\Delta f_{3\,dB}$=21 MHz. For the implementation 24, however, the maximum adjacent peak is −30 dB, lower than that of the theoretical response. This is because the conductance of n-MOS transistors 21A or 21B does not vary linearly with the linear W&S signal. The actual weighting function is somewhere between linear and Gauss.

Figure 13A:
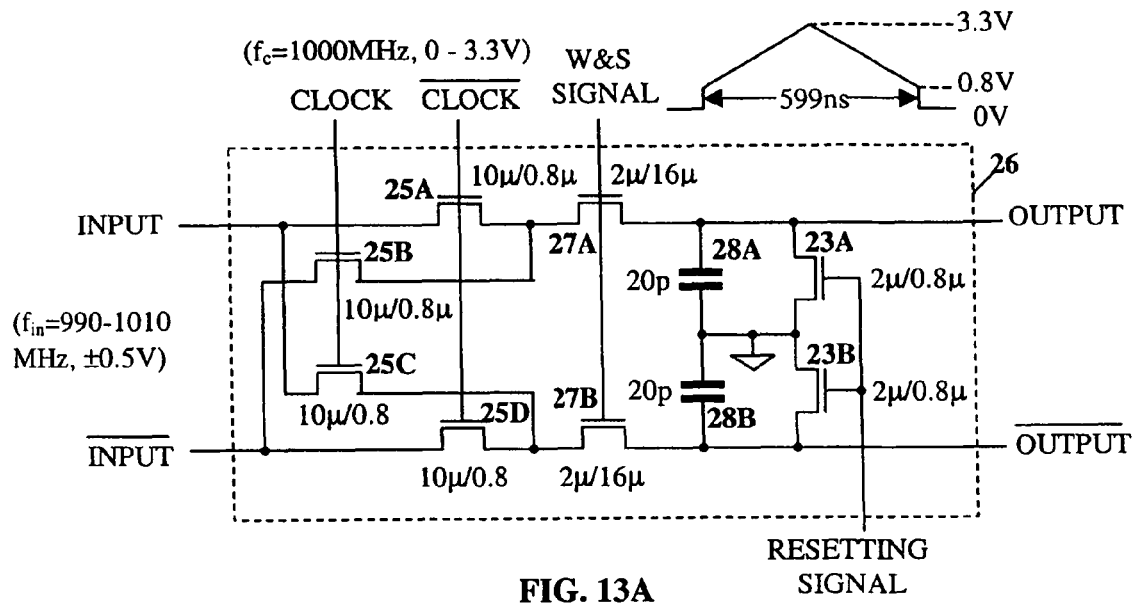
FIG. 13A is the circuit diagram according to FIG. 10 with n=599 in linear weighting at 1000 MHz.
Figure 13B:
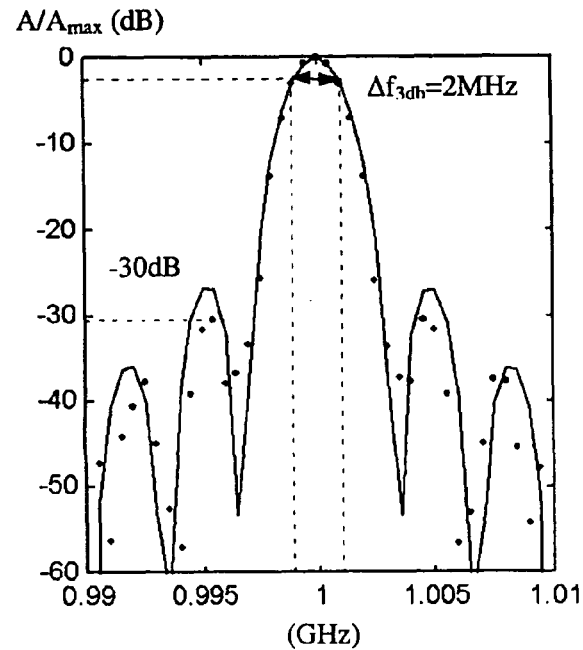
FIG. 13B is the resulting frequency response of the circuit in FIG. 13A.

An implementation 26 with n=599 in linear weighting at $f_c$=1000 MHz is shown in FIG. 13A. The clocked switches are n-MOS transistors 25A, 25B, 25C and 25D, 10 μm/0.8 μm. The W&S elements are n-MOS transistors 27A and 27B, 2 μm/16 μm. Note that the lengths of 27A and 27B are increased to 16 μm to limit the signal current and the capacitor voltage dung such a long charging period (599 ns). The resetting switches are n-MOS transistors 23A and 23B, 2 μm/0.8 μm. The capacitors are MOS capacitors 28A and 28B, both 20 pF. The width of the linear weighting W&S signal is 599 ns, corresponding to n=599. The maximum differential output sample voltage is around 100 mV. FIG. 13B shows the theoretical frequency response in solid line and the HSPICE simulated frequency response in dots for $f_{in}$=990-1010 MHz. The simulated frequency response is basically in accordance with the theoretical frequency response. Both have $\Delta f_{3\,dB}$=2 MHz. For the same reason mentioned above, the maximum adjacent peak of the implementation 26 is −30 dB, lower than that of the theoretical response.

Figure 14A:
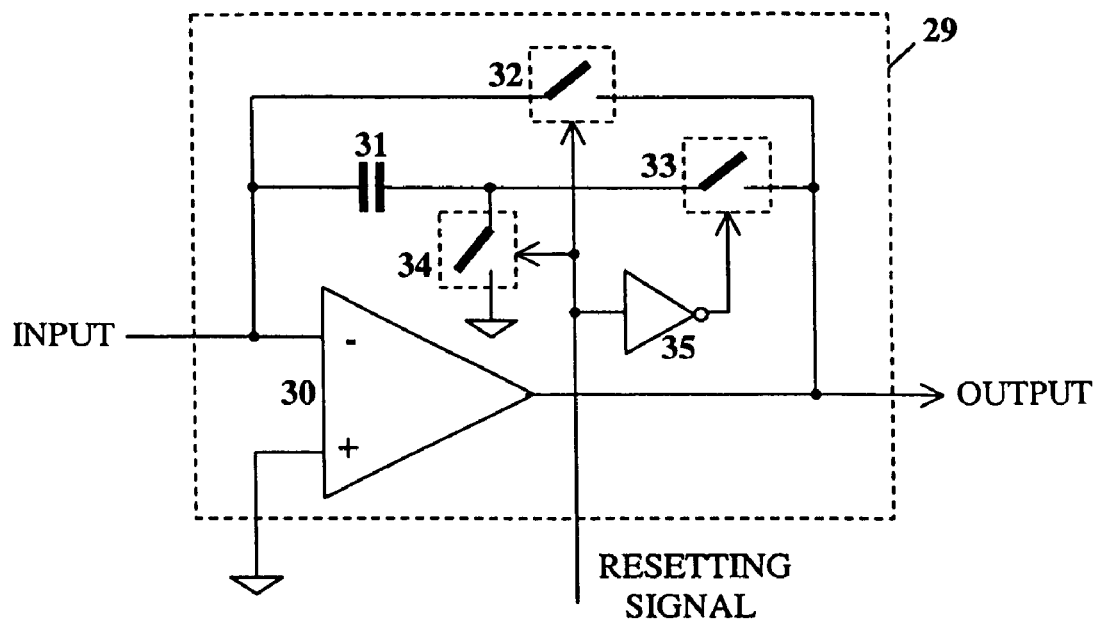
FIG. 14A is a circuit diagram of a single ended active integrator.
Figure 14B:
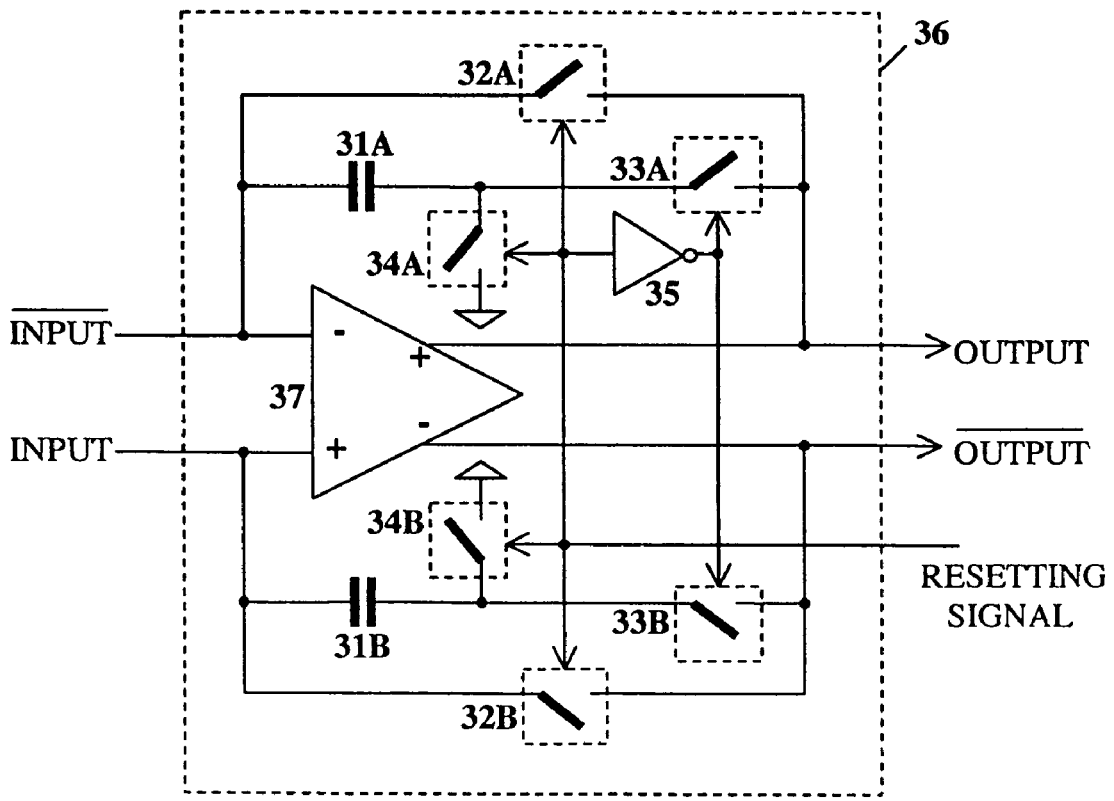
FIG. 14B is a circuit diagram of a differential active integrator.

FIG. 14A and FIG. 14B show active integrators for improving output swing and linearity, respectively. A single ended active integrator 29 is shown in FIG. 14A. It comprises a differential-in-single-out amplifier 30, an inverter 35, a capacitor 31, and switches 32, 33 and 34, as connected. An active integrator always keeps the signal input at virtual ground, eliminating the impact of capacitor voltage on the signal current. The bandwidth of amplifier 30 needs only to cover the signal base-band not the carrier, which makes it feasible. The inverter 35 produces an inverted resetting signal with a delay, using the resetting signal as the input, to control the switch 33 while the resetting signal controls the switches 32 and 34. During the resetting phase, the switches 32 and 34 are turned on, and the switch 33 is turned off. The voltage of capacitor 31 is reset to the input offset voltage of the amplifier 30. During the sampling phase, the switches 32 and 34 are turned off and the switch 33 is turned on. The capacitor 31 is charged by the signal current. In the same time, the offset voltage of the amplifier 30 is cancelled. A differential active integrator 36 is shown in FIG. 14B. It comprises a differential-in-differential-out amplifier 37, two capacitors 31A and 31B, an inverter 35, and switches 32A, 32B, 33A, 33B, 34A and 34B. It works basically in the same way as the integrator 29 except uses a differential input signal and gives differential outputs. The integrator 29 can replace the integrator 3 in FIG. 1A while the integrator 36 can replace the integrator 10 in FIG. 3.

Figure 15:
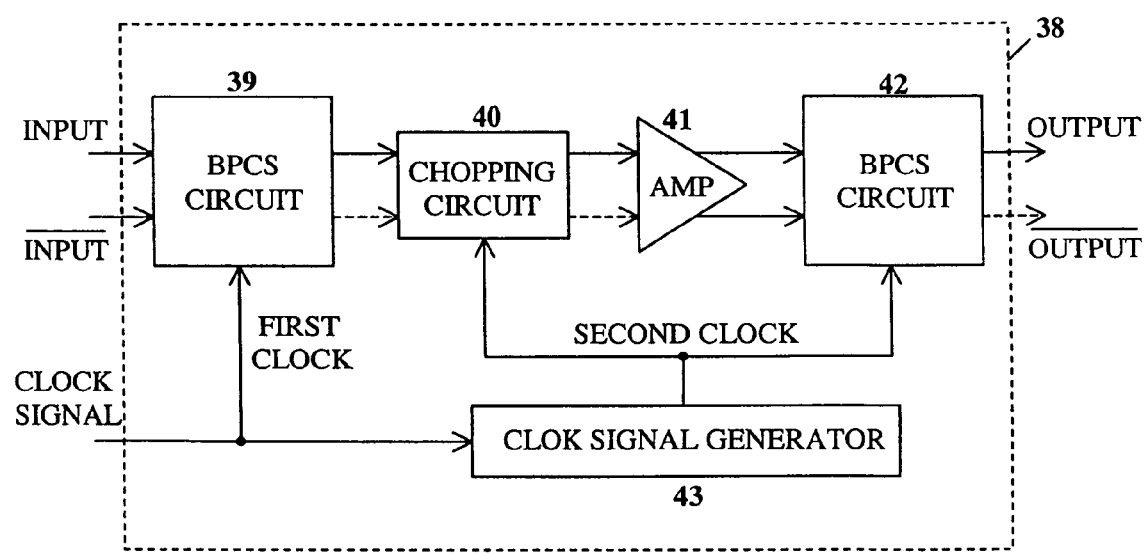
FIG. 15 is a block diagram of a two-step BPCS circuit.

FIG. 15 shows a two-step BPCS circuit 38. It comprises a first BPCS circuit 39, a chopping circuit 40, an amplifier 41, a second BPCS circuit 42, and a clock signal generator 43 generating a second clock. The first BPCS circuit 39 and the second BPCS circuit 42 can be any type of the BPCS circuits 5, 8, 11, 19, 24 and 26. To the first BPCS circuit 39, two ends of a differential analog signal are applied to its two inputs respectively, and a first clock is applied to its clock input. Signal samples with a first sample rate are produced from the first BPCS circuit 39 and fed to the chopping circuit 40. The samples are chopped symmetrically in time, controlled by the second clock. From the chopping circuit 40, the chopped signal with a new carrier frequency equal to the chopping frequency is fed to the amplifier 41, and the amplified differential signals are fed to two inputs of second BPCS circuit 42 respectively. Controlled by the second clock, the second BPCS circuit 42 produces the final sample output with a second sample rate. The two-step BPCS circuit 38 gives flexibility in performance trade-off. BPCS circuits in more steps can be built based on the two-step BPCS circuit 38.

Figure 16:
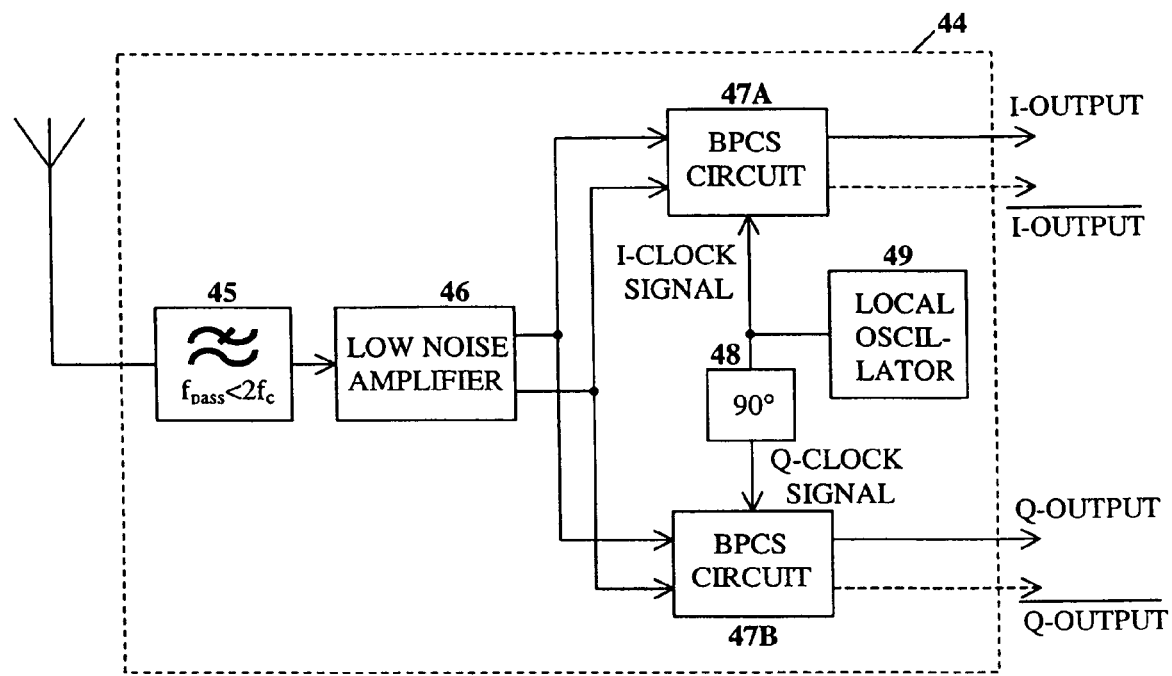
FIG. 16 is a block diagram of a front-end sampling radio receiver architecture.

A front-end sampling radio receiver architecture 44 is shown in FIG. 16. It comprises a low pass filter 45 with $f_{pass}<2f_c$ a differential-out low noise amplifier (LNA) 46, two BPCS circuits 47A and 47B, a 90° phase shifter 48, and a local oscillator 49. The radio signal from antenna is applied to the input of the low pass filter 45. The frequency components above $2f_c$ are greatly attenuated. The output of the low pass filter 45 is fed to the LNA 46 to produce differential outputs with a large enough amplitude. The differential outputs are fed to the inputs of BPCS circuits 47A and 47D simultaneously. In the same time, the I-clock signal produced by the local oscillator 49 is fed to the BPCS circuit 47A while the Q-clock signal reproduced by the 90° phase shifter 48 from the I-clock signal is fed to the BPCS circuit 473. The BPCS circuits 47A and 47B produce I-samples and Q-samples respectively. The sample outputs can be either converted to digital data immediately or further treated. The BPCS circuits 47A and 47B can be any of the BPCS circuits 5, 8, 11, 19, 24 and 26. The integrators in these circuits can be either passive integrators or active integrators. The radio receiver architecture 44 has filtering, mixing and sampling functions simultaneously at the front-end, which relaxes the performance demands on A/D conversion, avoids analog filters, and highly utilizes the capability of DSP. In principle, any narrow bandwidth, i.e. any high Q value, is possible. The center frequency of the filtering function can be easily programmed. It is indeed a superior radio receiver architecture with a wide application scope.

The sampling capacitors used in the CS and the BPCS circuits are much larger than that used in a voltage sampling circuit, resulting in low noise and low charge and clock feedthrough.

The BPCS circuit is simultaneously a filter, a mixer and a sampler, capable of working at radio frequencies. The center frequency, the bandwidth and the adjacent selectivity can be wet by the clock frequency, the number n and the shape of W&S signal, particularly useful for front-end sampling radio receiver and system-on-chip.

It is to be understood that even though numerous characteristics and features of the present invention have been set forth in the description, together with details of the function of the invention, the disclosure is illustrative only and changes may be made in detail within the scope of the invention defined by the following claims.

What is claimed is:

1. A front-end sampling radio receiver apparatus having a first and second band-pass charge sampling circuit comprising:
    a low pass filter with a bandwidth up to twice the clock frequency for receiving and filtering a radio signal, thereby producing a filtered signal;
    a low noise amplifier for producing a differentially amplified radio signal from the filtered signal;
    a local oscillator for producing an I-clock signal at its signal output; and
    a $\pi/2$ phase shifter with a signal input connected to the local oscillator for producing a Q-clock signal at its signal output with the same amplitude and $\pi/2$ phase shift with respect to said I-clock signal;
    wherein two ends of the signal output pair of said low noise amplifier are respectively connected both to the first band-pass charge sampling circuit and the second band-pass charge sampling circuit respectively, said I-clock signal output is connected to a clock input of said first band-pass charge sampling circuit, and said Q-clock signal output is connected to a clock input of said second band-pass charge sampling circuit, for producing base-band I-samples of said radio signal at a signal output or output pair of said first band-pass charge sampling circuit, base-band Q samples of said radio signal at the signal output or output pair of said second band-pass charge sampling circuit.

2. The front-end sampling radio receiver apparatus according to claim 1, wherein:
    said local oscillator, said phase shifter and clock generators of said first and second band-pass charge sampling circuits are combined for producing differential I-clock signals and Q-clock signals;
    said base-band I-sample and Q-samples are converted either by two separate analog-to-digital converters or by a single analog-to-digital converter with multiplexing to digital signals; and
    said digital signals are processed by a digital signal processing unit;
    whereby said front-end sampling radio receiver apparatus has simplified analog part and wherein the capability of the digital signal processing unit is highly utilized.

3. The front-end sampling radio receiver apparatus according to claim 1, wherein:
    the band-pass charge sampling circuit generates an output signal that represents a time integral of substantially only signal components of the differentially amplified radio signal having frequencies that are in a range between a first positive non-zero value and a second positive non-zero value.

* * * * *

UNITED STATES PATENT AND TRADEMARK OFFICE
CERTIFICATE OF CORRECTION

PATENT NO. : 8,035,421 B2  
APPLICATION NO. : 11/099460  
DATED : October 11, 2011  
INVENTOR(S) : Yuan Page 1 of 2

It is certified that error appears in the above-identified patent and that said Letters Patent is hereby corrected as shown below:

On the Title Page, in Field (62), under "Related U.S. Application Data", in Column 1, Line 2, delete "2," and insert -- 28, --, therefor.

In Fig. 15, Sheet 15 of 16, for Tag "43", delete "CLOK" and insert -- CLOCK --, therefor.

In Column 1, Line 43, delete "intergrator" and insert -- integrator --, therefor.

In Column 1, Line 60, delete "intergrator" and insert -- integrator --, therefor.

In Column 3, Line 13, delete "a a" and insert -- a --, therefor.

In Column 4, Line 11, delete "control, signal" and insert -- control signal --, therefor.

In Column 4, Line 19, delete "circuit" and insert -- circuit 1 --, therefor.

In Column 4, Line 59, delete "$\cos(\omega_{i2} + \phi_i))$," and insert -- $\cos(\omega_i t_2 + \phi_i))$. --, therefor.

In Column 4, Line 63, delete "$\sin(\omega_i \Delta t_s + \phi_i)$," and insert -- $\sin(\omega_i t_s + \phi_i)$, --, therefor.

In Column 5, Line 8, delete "$\sin((\omega_i \Delta t/\omega_i \Delta t)$" and insert -- $\sin(\omega_i \Delta t/\omega_i \Delta t)$ --, therefor.

In Column 6, Line 60, delete "$(2p-1)f_c - f_{in} = f_{in2} - (2p-1)f_c$," and insert -- $(2p-1)f_c - f_{in1} = f_{in2} - (2p-1)f_c$, --, therefor.

In Column 7, Line 1, delete "$0 < f_{in} < 2f_c$," and insert -- $0 < f_{in} < 2f_c$ --, therefor.

In Column 7, Line 20, delete " $0.99f_c < f_{in} < 1.01f_c$.," insert -- $0.99f_c < f_{in} < 1.01f_c$. --, therefor.

In Column 9, Line 33, delete "47D" and insert -- 47B --, therefor.

Signed and Sealed this  
Thirteenth Day of March, 2012

David J. Kappos  
*Director of the United States Patent and Trademark Office*

In Column 9, Line 37, delete "473." and insert -- 47B. --, therefor.

In Column 9, Line 59, delete "wet" and insert -- set --, therefor.

UNITED STATES PATENT AND TRADEMARK OFFICE
CERTIFICATE OF CORRECTION

Page 1 of 2

PATENT NO. : 8,035,421 B2
APPLICATION NO. : 11/099460
DATED : October 11, 2011
INVENTOR(S) : Yuan It is certified that error appears in the above-identified patent and that said Letters Patent is hereby corrected as shown below:

On the Title Page, in Field (62), under "Related U.S. Application Data", in Column 1, Line 2, delete "2," and insert -- 28, --, therefor.

In Fig. 12A, Sheet 12 of 16, below "25C", insert -- 10μ/0.8μ --.

In Fig. 12A, Sheet 12 of 16, below "25D", insert -- 10μ/0.8μ --.

In Fig. 13A, Sheet 13 of 16, below "25C", insert -- 10μ/0.8μ --.

In Fig. 13A, Sheet 13 of 16, below "25D", insert -- 10μ/0.8μ --.

In Fig. 15, Sheet 15 of 16, for Tag "43", delete "CLOK" and insert -- CLOCK --, therefor.

In Column 1, Line 43, delete "intergrator" and insert -- integrator --, therefor.

In Column 1, Line 60, delete "intergrator" and insert -- integrator --, therefor.

In Column 3, Line 13, delete "a a" and insert -- a --, therefor.

In Column 4, Line 11, delete "control, signal" and insert -- control signal --, therefor.

In Column 4, Line 19, delete "circuit" and insert -- circuit 1 --, therefor.

In Column 4, Line 59, delete "$\cos(\omega_{i2} + \phi_i))$," and insert -- $\cos(\omega_i t_2 + \phi_i))$. --, therefor.

In Column 4, Line 63, delete "$\sin(\omega_i \Delta t_s + \phi_i)$," and insert -- $\sin(\omega_i t_s + \phi_i)$, --, therefor.

This certificate supersedes the Certificate of Correction issued March 13, 2012.

Signed and Sealed this
First Day of May, 2012

David J. Kappos
*Director of the United States Patent and Trademark Office*

CERTIFICATE OF CORRECTION (continued)
U.S. Pat. No. 8,035,421 B2

In Column 5, Line 8, delete "sin(($\omega_i \Delta t/\omega_i \Delta t$)" and insert -- sin($\omega_i \Delta t/\omega_i \Delta t$) --, therefor.

In Column 6, Line 60, delete "(2p–1)$f_c$–$f_{in}$=$f_{in2}$–(2p–1)$f_c$," and insert
-- (2p–1)$f_c$–$f_{in1}$=$f_{in2}$–(2p–1)$f_c$, --, therefor.

In Column 7, Line 1, delete "0< $f_{in}$ <2$f_c$," and insert -- 0< $f_{in}$ <2$f_c$ --, therefor.

In Column 7, Line 20, delete " 0.99$f_c$<$f_{in}$<1.01$f_c$.," insert -- 0.99$f_c$<$f_{in}$<1.01$f_c$. --, therefor.

In Column 9, Line 33, delete "47D" and insert -- 47B --, therefor.

In Column 9, Line 37, delete "473." and insert -- 47B. --, therefor.

In Column 9, Line 59, delete "wet" and insert -- set --, therefor.